United States Patent [19]
Lin et al.

[11] Patent Number: 5,612,239
[45] Date of Patent: Mar. 18, 1997

[54] USE OF OXIDE SPACERS FORMED BY LIQUID PHASE DEPOSITION

[75] Inventors: Jengping Lin, Tayuan Village; Sun-Chieh Chien, Hsin-chu, both of Taiwan

[73] Assignee: United Microelectronics Corporation, Hsin-chu, Taiwan

[21] Appl. No.: 519,069

[22] Filed: Aug. 24, 1995

[51] Int. Cl.$^6$ ............................................. H01L 21/336
[52] U.S. Cl. .................................... 437/44; 437/238
[58] Field of Search ......................... 437/41 RLD, 44, 437/41 SW, 34, 56, 57, 238

[56] References Cited

U.S. PATENT DOCUMENTS

| | | | |
|---|---|---|---|
| 5,053,349 | 10/1991 | Matsuoka | 437/41 |
| 5,270,233 | 12/1993 | Hamatake | 437/44 |
| 5,286,664 | 2/1994 | Horiuchi | 437/44 |
| 5,429,956 | 7/1995 | Shell et al. | 437/44 |

*Primary Examiner*—Mary Wilczewski
*Attorney, Agent, or Firm*—William H. Wright

[57] ABSTRACT

A process for manufacturing an LDD type of FET, based on the salicide process, is described. Said process does not lead to short circuits between the drain region and and the main body of the FET through the buried contact. The process is based on the use of Liquid Phase Deposition (LPD) as the method for growing the oxide layer from which the spacers are formed. Since oxide layers formed through LPD will deposit preferentially on silicon and silicon oxide surfaces relative to photoresist surfaces, the areas in which the LPD layer forms are readily controlled. This feature allows the buried contact layer to be replaced by an extended drain region which can be connected to other parts of the integrated circuit (by the salicide process) without the danger of shorting paths being formed therein.

17 Claims, 3 Drawing Sheets

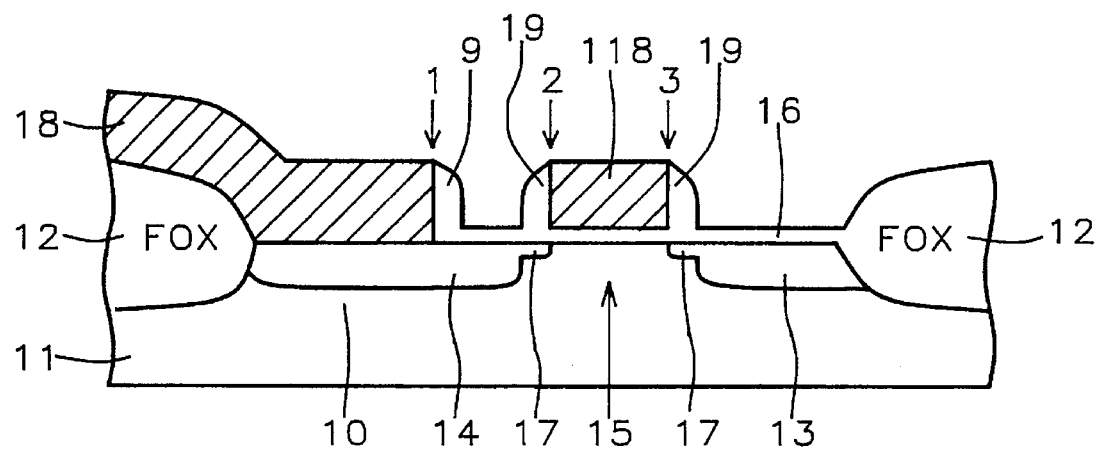
FIG. 1 – Prior Art
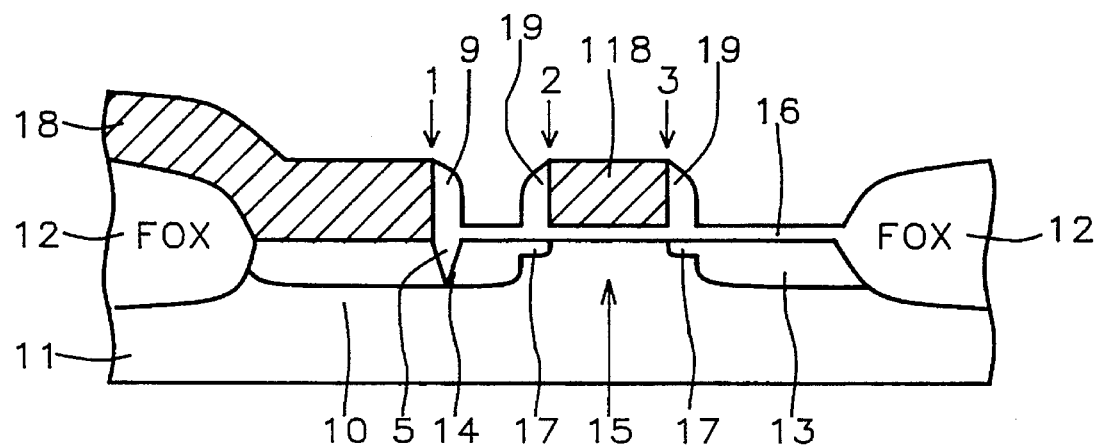
FIG. 2 – Prior Art
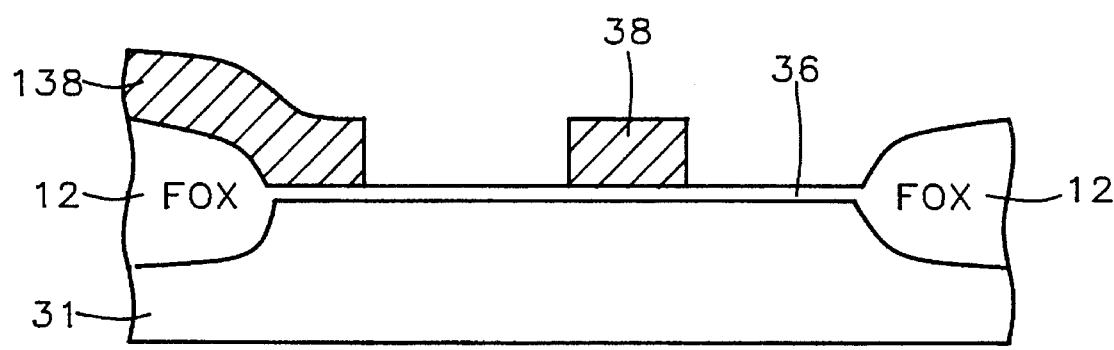
FIG. 3

5,612,239

USE OF OXIDE SPACERS FORMED BY LIQUID PHASE DEPOSITION

BACKGROUND OF THE INVENTION (1) FIELD OF THE INVENTION

The invention relates to the general field of semiconductor integrated circuits, more particularly to the formation of the spacers that form part of the LDD salicide process.

(2) DESCRIPTION OF THE PRIOR ART

Field Effect Transistors (FETs), in their simplest form, comprise a body of semiconducting material, usually silicon, having two regions of opposite conductivity type to its own, embedded within it and spaced a short distance apart. Said regions of opposite conductivity type are referred to as source and drain regions, the region between them being referred to as the gate region. In most FET designs the surface of the silicon in the gate region is covered with a thin layer of silicon oxide. Electrically separate electrodes contact all three regions.

Normally, when voltage is applied between source and drain, very little current flows since one of the two PN junctions (relative to the silicon body) will always be back biassed. When, however, voltage of the right polarity is applied to the gate the concentration of minority carriers in a thin layer immediately beneath the gate oxide can be increased to a level sufficient for it to assume the same conductivity type as the source and drain regions, thereby allowing current to flow between them.

FETs operate most efficiently if the area of the interface between source/drain and gate region is kept as small as possible and, additionally, if the resistivity of the source/drain regions at said interface is as high as possible. However, this requirement conflicts with the requirement that any series resistance introduced into the basic FET circuit by the source and drain must be kept as low as possible.

These two conflicting sets of requirements have been largely reconciled in the Lightly Doped Drain (LDD) design, an example of which is illustrated in FIG. 1 as a schematic cross-section. Source and drain regions 13 and 14, respectively, are embedded within silicon body 11, separated from one another by gate region 15. For an NPN FET design, body 11 will be P type while regions 13 and 14 are of type N+, i.e. low resistivity, satisfying the requirement that they introduce minimum series resistance into the circuit. To satisfy the requirement of high resistivity and small area at the interface with region 15, shallow layers 17 of type N—, i.e. high resistivity, extend outward a short distance from regions 13 and 14 to form the source/drain interface with gate region 15.

Since FIG. 1 is not drawn to scale, it does not bring out the fact that the dimensions of the various regions are very small. Furthermore, it is essential that regions 13, 14, and 17 all be very precisely located relative to one another. Also, regions 13 and 14 as well as the top surface of oxide layer 16 must all be fully covered by suitable electrical contacts that do not accidentally connect (short circuit) to one another.

These latter requirements are met by use of the Self Aligned Silicide (Salicide) process. Initially a body of silicon is provided that includes field isolation regions of thick oxide, such as 12 in FIG. 1. The entire body is then coated with a thin layer of oxide (such as 16). Said layer is selectively removed in the region to the left of arrow 1 in FIG. 1.

Using the remaining portions of thin oxide layer 16 as a mask, N+ region 10 is formed, by standard diffusion methods, and serves the purpose of a buried contact that will eventually connect the drain of the device seen in the figure to the gate of a similar device (not shown). This is followed by the deposition of a layer of polycrystalline silicon (poly) such as 18 or 118 in FIG. 1.

The poly layer is then selectively removed in the areas between arrows 1 and 2 and to the right of arrow 3, leaving pedestal 118 above gate region 15. The entire structure is now subjected to an ion implantation process to produce a shallow, lightly doped layer where poly has been removed.

A layer of silicon oxide is then selectively formed on the vertical side walls below arrows 1, 2, and 3, to form spacers 9 and 19, and the structure is subjected to a second ion implantation process, to form the relatively deep, heavily doped, layers 13 and 14. Region 17 is now all that is left of the previously formed lightly doped layer. The structure shown in FIG. 1 has now been achieved.

Because of misalignment problems, it can happen that the edge of the afore-mentioned poly layer to the left of arrow 1 ends up too far to the left, leaving a small area at the surface of buried contact 10 unprotected by oxide during the etch removal of the poly. Consequently, V-shaped trench 5 may unintentionally be etched into the silicon surface, as shown in FIG. 2. Such a trench can cause serious problems such as short circuiting all the way through the buried contact down to the main silicon body 11. The present invention provides a method for achieving the structure of FIG. 1, with no possibility of trench formation.

To complete the process of making full, but non-touching, contacts to the source, drain, and gate regions, spacer 9 is selectively removed, leaving spacers 19 in place. Then, a layer of a refractory metal is deposited over the entire structure which is then subjected to a heat treatment of sufficient intensity to cause said refractory metal layer to react with underlying poly layers 18 and 118 and to be fully converted to a silicide.

Finally, a selective etch treatment is used to remove any unreacted (non-silicided) refractory metal from the structure, in particular those portions of said refractory metal layer that were in contact with spacers 19, as opposed to poly layer 18 or 118. This completes the salicide process.

A number of issued patents describe various apsects of and refinements to the salicide process but none, of which we are aware, addresses the above discussed problem of potential shorting through a buried contact layer. For example, Matsuoka (U.S. Pat. No. 5,053,349 Oct. 1, 1991) teaches several ways to use a refractory metal layer to connect a poly layer to the source, drain, and gate regions. With tungsten this is achieved by means of a deposition technique that causes metal to be selectively deposited on poly but not on oxide (spacers). With titanium a similar result is achieved by forming the silicide and then selectively etching. In Matsuoka's invention, the FET design is not of the LDD type and source/drain regions are formed through diffusion rather than ion implantation.

SUMMARY OF THE INVENTION

It is an object of the present invention to provide a method for manufacturing an LDD type of FET structure that is not subject to the possibility of a short circuit between the drain region and the main substrate through a buried contact.

A further object of the present invention is to provide a convenient method for selectively forming oxide spacers in only those places where they are needed, thereby avoiding unnecessary etching of field oxide in the buried contact area during the removal of unwanted spacers.

These objects have been achieved by using Liquid Phase Deposition (LPD) as the method for growing the oxide layer from which the spacers are formed. Since oxide layers formed through LPD will deposit preferentially om silicon and silicon oxide surfaces relative to photoresist surfaces, the areas in which the LPD layer formed were readily controlled. This feature allowed the buried contact layer to be replaced by an extended drain region which could be connected to other parts of the integrated circuit (by the salicide process) without the danger of shorting paths being formed therein.

BRIEF DESCRIPTION OF THE DRAWINGS

FIG. 1 shows a cross-section of an FET manufactured by an LDD process based on the prior art.

FIG. 2 shows how the device of FIG. 1 may be subject to short circuiting through its buried contact.

FIGS. 3–7 show successive steps in the manufacturing of an FET using an LDD salicide process based on the present invention.

DESCRIPTION OF THE PREFERRED EMBODIMENTS

Figure 4:
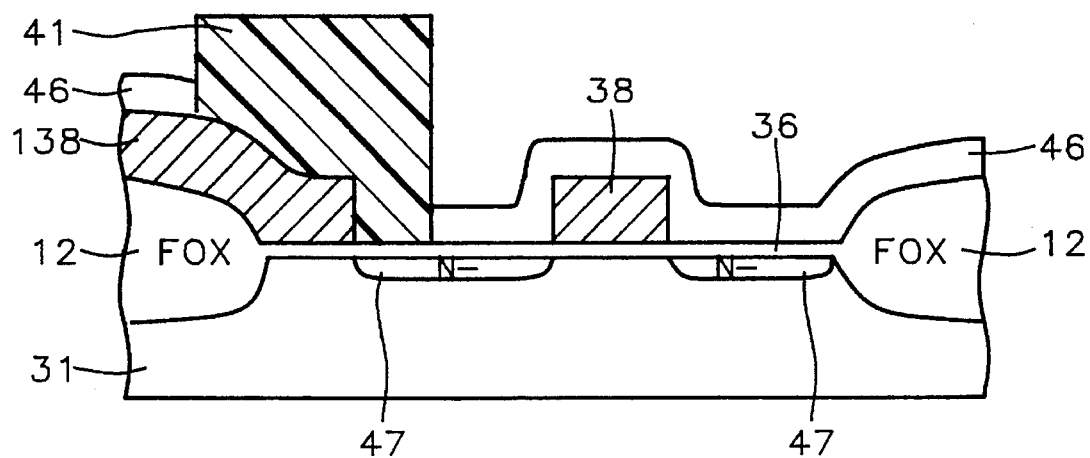

The process that forms the principal subject of the present invention is aimed at the formation of FETs of the LDD type of design. The embodiment which we will describe below is for an NPN version but it will be understood by those skilled in the art that a PNP structure could just as well have been used as a vehicle for illustration.

Referring now to FIG. 3, the process begins with the provision of a P type body of silicon 31, including field isolation regions 12 of thick oxide. A thin layer of gate oxide 36, is overcoated with a layer of poly which is selectively etched to form gate pedestal 38 and drain connector 138. The thickness of gate oxide layer 36 may be anywhere from about 50 to 150 Angstrom units while that of poly pedestal 38 may be between about 2,000 and 4,000 Angstrom units.

Referring to FIG. 4, the entire structure is now subjected to an ion implantation process to produce a shallow, lightly doped N type layer (layer 47) in the region not covered with poly. The voltage used to accelerate the ions is in the range of from about 30 to 60 kV, resulting in a layer thickness between about 500 and 1,500 Angstrom units. The dosage is in the range of from about $1\times10^{13}$ to $5\times10^{13}$ atoms/sq. cm.

Drain connector 138 is now protected by patterned photoresist layer 41 and the structure is subjected to Liquid Phase Deposition (LPD) of silicon oxide. Said LPD process is based on the following chemical reactions:

(1)

(2)

Thus, if a solution of hydrofluoric acid has been saturated with silicon dioxide, the addition of boric acid will consume some of the hydrofluoric acid (reaction 2 above) thereby causing reaction 1 to proceed from left to right; that is, precipitating some silicon dioxide out of solution. This precipitation is known to occur preferentially onto silicon and silicon oxide surfaces as opposed to surfaces of materials such as photoresist. Returning to FIG. 4, as boric acid is added, LPD oxide layer 46 is slowly built up. Its growth is allowed to continue until layer 46 has a thickness that is between about 500 and 2,000 Angstrom units.

Figure 5:
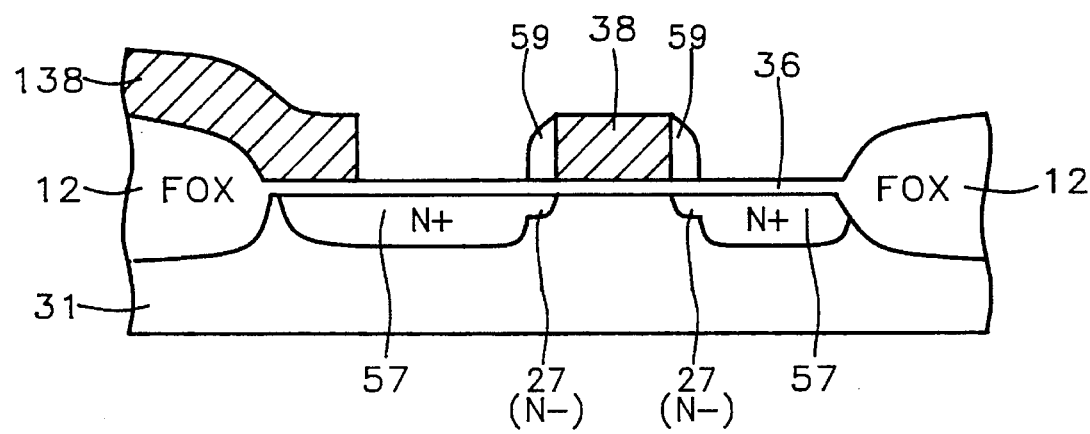

Referring now to FIG. 5, the oxide layer 46 has now been subjected to anisotropic reactive ion etchibg (RIE), resulting in the formation of spacers 59. The entire structure is now subjected to a second ion implantation process using relatively high ion energies and doses (voltages from about 60 to 120 kV and doses between about $1\times10^{15}$ and $5\times10^{15}$ atoms/sq. cm.) so that regions 57 become strongly N type (N+) and are between about 1,000 and 2,500 Angstrom units thick, thereby forming a source and a drain. Most of layer 47 (in FIG. 4) has been replaced by 57, all that remains being projections 27 that interface with the gate region.

Figure 6:
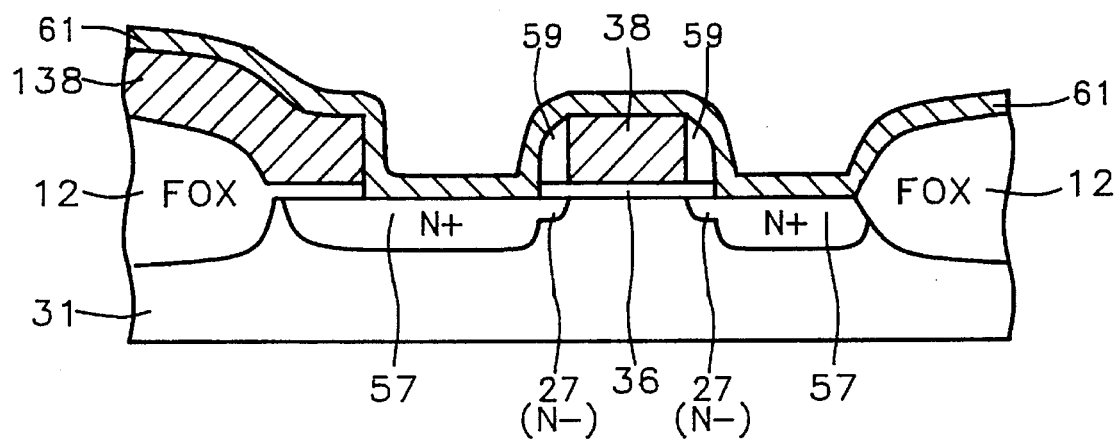

To complete the process, it is necessary to make full, but non-touching, connections to the source, drain, and gate regions. Referring to FIG. 6, gate oxide layer 36 is removed from areas not covered by poly or a spacer. A layer of a refractory metal 61 between about 200 and 800 Angstrom units thick is deposited over the structure which is then subjected to a heat treatment, typically heating at a temperature between about 650° and 700° C. for between about 1 and 10 minutes in a nitrogen atmosphere, using Rapid Thermal Anneal type equipment. This is sufficient to cause it to react with the underlying poly (38 and 138) and be fully converted to a silicide, shown in FIG. 7 as layer 71. Our preferred refractory metal has been titanium but any of several other refractory metals such as tungsten and cobalt could also be used.

Figure 7:
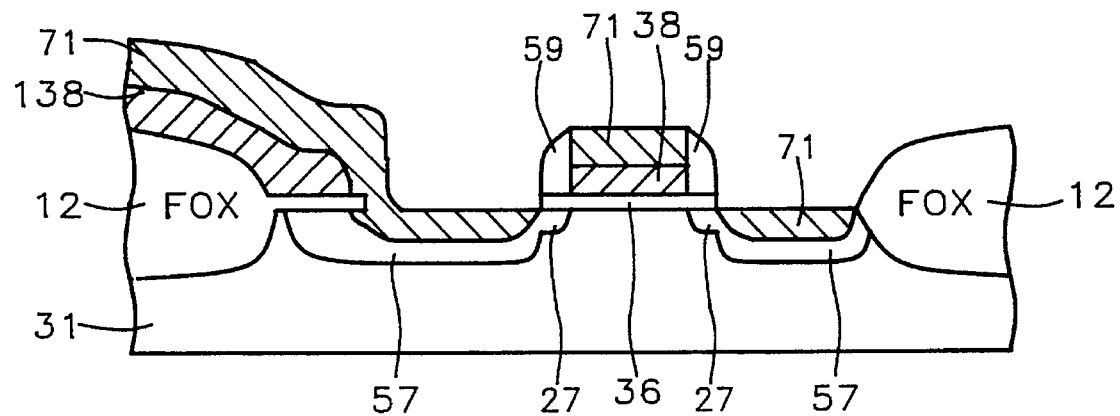

Continuing our reference to FIG. 7, a selective etch treatment is used to remove any unreacted (non-silicided) refractory metal from the structure, in particular those portions that were in contact with spacers 59, rather than poly layer 38. Selective etching (in the case of titanium) is acomplished by immersing the structure in a mixture of ammonia and hydrogen peroxide at a temperature between about 70° and 90° C. for between about 10 and 30 minutes. Following the selective etch, the system is given a final anneal treatment in nitrogen at a temperature between about 700° and 800° C. for between about 10 and 60 seconds.

While the invention has been particularly shown and described with reference to this preferred embodiment, it will be understood by those skilled in the art that various changes in form and details may be made without departing from the spirit and scope of the invention.

What is claimed is:

1. A process for manufacturing a field effect transistor and connections thereto, comprising:

(a) providing a structure that comprises a body of P type silicon, including field isolating regions comprised of thick layers of silicon oxide, the surface of said silicon body being covered by a thin layer of silicon oxide in the regions between said field isolating regions;

(b) depositing a layer of polycrystalline silicon over said structure;

(c) patterning and then etching said layer of polycrystalline silicon, down to the level of said thin layer of silicon oxide, so as to leave a gate pedestal in the region between said field isolation regions and a drain connector over a field isolation region on one side of said gate pedestal;

(d) then subjecting the structure to ion implantation of N type dopant material with energies low enough for penetration to be slight, to a dosage level such that the implanted silicon becomes lightly N type;

(e) protecting said drain connector with a layer of photoresist that extends into the region between said drain connector and said gate pedestal;

(f) forming, through liquid phase deposition, a layer of silicon oxide that covers all areas not protected by said layer of photoresist and then removing said layer of photoresist;

(g) anisotropically reactive ion etching said layer of silicon oxide, thereby forming spacers on the vertical side walls of said gate pedestal;

(h) subjecting the structure to ion implantation of N type dopant material to a dosage level such that the implanted silicon becomes strongly N type;

(i) removing said layer of thin oxide wherever it is uncovered;

(j) coating the structure with a layer of a refractory metal;

(k) heating the structure until said refractory metal has been converted to its silicide wherever it is in contact with silicon; and (l) etching the structure with an etchant that removes said refractory metal and does not remove said refractory metal silicide.

2. The process of claim 1 wherein the thickness of said thin layer of silicon oxide is between about 50 and about 150 Angstrom units.

3. The process of claim 1 wherein the thickness of said layer of polycrystalline silicon is between about 2,000 and about 4,000 Angstrom units.

4. The process of claim 1 wherein the voltage used to accelerate the ions in step (d) is between about 30 and about 60 kV, resulting in a penetration depth that is between about 500 and about 1,500 Angstrom units.

5. The process of claim 1 wherein the ion dosage achieved in step (d) is between about $1 \times 10^{13}$ and about $5 \times 10^{13}$ atoms/square centimeter.

6. The process of claim 1 wherein the voltage used to accelerate the ions in step (h) is between about 60 and about 120 kV, resulting in a penetration depth that is between about 1,000 and about 2,500 Angstrom units.

7. The process of claim 1 wherein the ion dosage achieved in step (h) is between about $1 \times 10^{15}$ and about $5 \times 10^{15}$ atoms/square centimeter.

8. The process of claim 1 wherein said refractory metal is taken from the group consisting of titanium, tungsten, and cobalt.

9. The process of claim 1 wherein the thickness of said refractory metal layer is between about 200 and about 800 Angstrom units.

10. The process of claim 1 wherein step (k) further comprises heating in an atmosphere of nitrogen at a temperature between about 650° and about 700° C. for from about 10 to about 60 seconds.

11. The process of claim 1 wherein step (1) further comprises immersion in an aqueous mixture of ammonia and hydrogen peroxide for between about 10 and about 30 minutes at a temperature between about 70° and about 90° C.

12. The process of claim 1 wherein step (f) further comprises immersing the structure in a saturated solution of silicon dioxide in hydrofluoric acid, and then adding boric acid, thereby causing the precipitation of silicon dioxide from the solution as a deposited layer.

13. The process of claim 12 wherein the thickness of said layer that resulted from the precipitation of silicon dioxide is between about 500 and about 2,000 Angstrom units.

14. A process for forming sidewall spacers on a silicon pedestal comprising:

(a) providing a body of silicon that includes a silicon pedestal;

(b) protecting, with photoresist, all vertical surfaces present in said body, except the sidewalls of said silicon pedestal;

(c) forming, through liquid phase deposition, a layer of silicon oxide that covers all areas not protected by said layer of photoresist;

(d) removing said layer of photoresist; and (e) anisotropically etching said layer of silicon oxide, thereby forming spacers on the vertical sidewalls of said silicon pedestal.

15. The process of claim 14 wherein said silicon pedestal is one of a plurality of such pedestals whose linear dimensions may differ one from another.

16. The process of claim 14 wherein step (c) further comprises immersing the structure in a saturated solution of silicon dioxide in hydrofluoric acid, and then adding boric acid, thereby causing the precipitation of silicon dioxide from the solution as a deposited layer.

17. The process of claim 16 wherein the thickness of said layer that resulted from the precipitation of silicon dioxide is between about 500 and about 2,000 Angstrom units.

* * * * *